United States Patent
Chen et al.

(10) Patent No.: US 8,624,223 B2
(45) Date of Patent: *Jan. 7, 2014

(54) SIDE-GATE DEFINED TUNABLE NANOCONSTRICTION IN DOUBLE-GATED GRAPHENE MULTILAYERS

(71) Applicant: International Business Machines Corporation, Armonk, NY (US)

(72) Inventors: Ching-tzu Chen, Ossining, NY (US); Shu-Jen Han, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/668,401

(22) Filed: Nov. 5, 2012

(65) Prior Publication Data

US 2013/0328017 A1 Dec. 12, 2013

Related U.S. Application Data

(63) Continuation of application No. 13/494,635, filed on Jun. 12, 2012.

(51) Int. Cl.
*H01L 29/06* (2006.01)
*H01L 31/00* (2006.01)

(52) U.S. Cl.
USPC .............. 257/27; 257/9; 257/20; 257/26

(58) Field of Classification Search
USPC ........................... 257/9, 20, 26, 27
See application file for complete search history.

(56) References Cited

U.S. PATENT DOCUMENTS

| 7,858,454 | B2 | 12/2010 | Kalburge |
| 8,072,008 | B2 | 12/2011 | Mukasa et al. |
| 8,105,928 | B2 | 1/2012 | Lin et al. |
| 2009/0140801 | A1 | 6/2009 | Ozyilmaz et al. |
| 2010/0085678 | A1 | 4/2010 | Jefferson et al. |
| 2011/0084251 | A1 | 4/2011 | Dilabio et al. |
| 2011/0227044 | A1* | 9/2011 | Kawanaka et al. ............ 257/29 |

(Continued)

OTHER PUBLICATIONS

Chen, C.T., et al., "Graphene-Side-Gate Engineering," IEEE Electron Device Letters, Issue 99, 2012, 3 pgs.

(Continued)

*Primary Examiner* — Seahvosh Nikmanesh
*Assistant Examiner* — Brigitte Paterson
(74) *Attorney, Agent, or Firm* — Jon A. Gibbons; Fleit Gibbons Gutman Bongini & Bianco PL

(57) ABSTRACT

A graphene-based electrically tunable nanoconstriction device and a non-transitory tangible computer readable medium encoded with a program for fabricating the device that includes a back-gate dielectric layer over a conductive substrate are described. The back-gate dielectric layer may be hexagonal boron nitride, mica, SiOx, SiNx, BNx, HfOx or AlOx. A graphene layer is an AB-stacked bi-layer graphene layer, an ABC-stacked tri-layer graphene layer or a stacked few-layer graphene layer. Contacts formed over a portion of the graphene layer include at least one source contact, at least one drain contact and at least one set of side-gate contacts. A graphene channel with graphene side gates is formed in the graphene layer between at least one source contact, at least one the drain contact and at least one set of side-gate contacts. A top-gate dielectric layer is formed over the graphene layer. A top-gate electrode is formed on the top-gate dielectric layer.

26 Claims, 5 Drawing Sheets

(56) References Cited

U.S. PATENT DOCUMENTS

2012/0082614 A1*  4/2012  Lee et al. .................... 423/460
2012/0149173 A1*  6/2012  Farooq et al. ................ 438/458

OTHER PUBLICATIONS

Zhu, W., et al., "Silicon Nitride Gate Dielectrics and Band Gap Engineering in Graphene Layers," Nano Lett., vol. 10, No. 9, 2010, pp. 3572-3576.

Li, X., et al., "Top-and Side-Gated Epitaxial Graphene Field Effect Transistors," Phys. Stat. Sol. A, vol. 207, No. 2, 2010, pp. 286-290.

Tian, J.F., et al., "Annbipolar Graphene Field Effect Transistors by Local Metal Side Gates," Appl. Phys. Lett., vol. 96, 2010, 263110, 3 pgs.

Tombros, N., et al., "Quantized Conductance of a Suspended Graphene Nanoconstriction," Nature Physics, vol. 7, 2011, pp. 697-700.

* cited by examiner

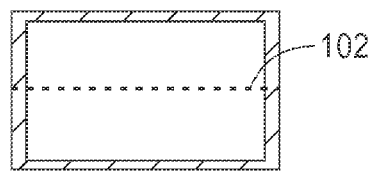
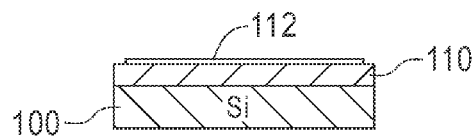
FIG. 1A　　　　　　FIG. 1B
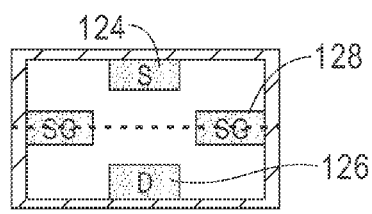
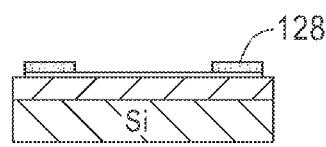
FIG. 2A　　　　　　FIG. 2B
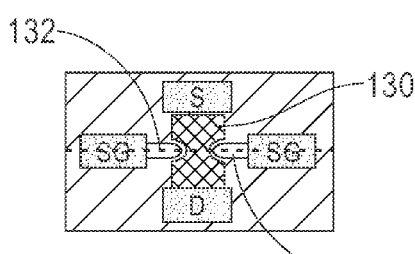
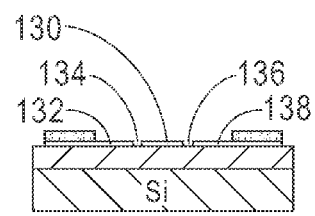
FIG. 3A　　　　　　FIG. 3B
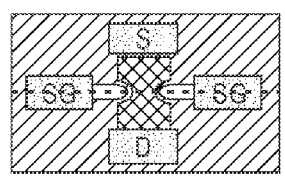
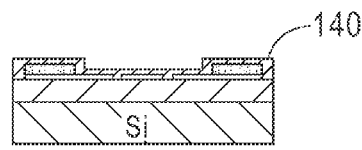
FIG. 4A　　　　　　FIG. 4B
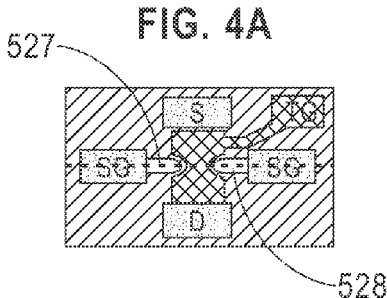
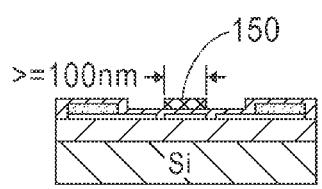
FIG. 5A　　　　　　FIG. 5B

US 8,624,223 B2

SIDE-GATE DEFINED TUNABLE NANOCONSTRICTION IN DOUBLE-GATED GRAPHENE MULTILAYERS

CROSS-REFERENCE TO RELATED APPLICATIONS

This application is based upon and claims priority from prior U.S. patent application Ser. No. 13/494,635, filed on Jun. 12, 2012, the entire disclosure of which is herein incorporated by reference.

BACKGROUND OF THE INVENTION

The present invention relates generally to semiconductor devices and, more particularly, to a graphene based electrically tunable nanoconstriction device.

Quantum dot (QD) technology, in particular the double-dot spin qubit scheme, has been a serious contender among solid state qubits because of its compactness and scalability. See for example "*Coherent manipulation of coupled electron spins in semiconductor quantum dots*", J. R. Petta, A. C. Johnson, J. M. Taylor, E. A. Laird, A. Yacoby, M. D. Lukin, C. M. Marcus, M. P. Hanson, A. C. Gossard, Science 309, 2180 (2005). Current QD devices have predominantly been built using III-V materials, such as the GaAs/AlGaAs heterostructure. The intrinsic noise generated by the nuclear spin fluctuations in these materials severely limits the number of quantum-gate operations before decoherence sets in, posing a grave challenge for implementing quantum error correction. See for example "*Dephasing time of GaAs electron-spin qubits coupled to a nuclear bath exceeding 200 μs*", H. Bluhm, S. Foletti, I. Neder, M. Rudner, D. Mahalu, V. Umansky, A. Yacoby, Nature Physics 7, 109 (2011).

Graphene, as a zero nuclear-spin system, can easily bypass the bottleneck stated above, giving graphene QDs a clear advantage over the 2DEG QDs in III-V materials. See "*Spin qubits in graphene quantum dots*", Björn Trauzettel, Denis V. Bulaev, Daniel Loss, Guido Burkard, Nature Physics 3, 192 (2007). The most crucial step in building a graphene QD is the fabrication of nanoconstrictions for control of electron tunneling on and off the dot and between dots within a qubit. It is therefore essential that NO strong impurity resonance state sits in the constriction region to trap electrons.

Despite the clear research direction and countless efforts devoted to reap the benefits of graphene for quantum computation, graphene QD qubits are still yet to exist. Besides, the only report on graphene quantum point contact has been a one-shot suspended device with very limited practical value, since the constriction size is neither controllable nor tunable. See for example "*Quantized conductance of a suspended graphene nanoconstriction*", Nikolaos Tombros, Alina Veligura, Juliane Junesch, Marcos H. D. Guimaraes, Ivan J. Vera-Marun, Harry T. Jonkman, Bart J. van Wees, Nature Physics 7, 697 (2011).

The root cause of this stalled progress lies in the lack of band-gap in graphene. Because of its zero band-gap, electrostatic gating for charge depletion and charge confinement is extremely difficult. Nearly all efforts on making graphene quantum devices have thus relied on defining the constriction and quantum-dot geometry using reactive-ion etching (RIE) instead of tunable electrostatic gating. See for example "*Tunable Coulomb blockade in nanostructured graphene*", C. Stampfer, J. Güttinger, F. Molitor, D. Graf, T. Ihn, and K. Ensslin, Appl. Phys. Lett. 92, 012102 (2008) and "*Chaotic Dirac billiard in graphene quantum dots*", L. A. Ponomarenko, F. Schendin, M. I. Katsnelson, R. Yang, E. W. Hill, K. S. Novoselov, and A. K. Geim, Science 320, 356 (2008). This etching-based geometrical confinement approach incurs severe damage to the edge of the already narrow graphene nanoconstrictions (<50 nm), causing inevitable localized resonant states and rendering the graphene dots useless for qubit applications. See for example "*Quantum Dot Behavior in Graphene Nanoconstrictions*" K. Todd, H. T. Chou, S. Amasha, D. Goldhaber-Gordon, Nano Lett. 9, 416 (2009) and "*Imaging localized states in graphene nanosctructures*" S. Schnez, J. Guttinger, M. Huefner, C. stampfer, K. Ensslin, T. Ihn, Phys. Rev. B 82, 165445 (2010).

BRIEF SUMMARY

A novel semiconductor device and process for forming the device is disclosed. More specifically a graphene-based gate-tunable electronic nanoconstriction device is described The device includes a back-gate dielectric layer formed over a conductive substrate. The back-gate dielectric layer in one example is hexagonal boron nitride (h-BN), mica, SiOx, SiNx, BNx, HfOx, AlOx, and combinations thereof.

Next a graphene layer is formed over the back-gate dielectric layer. The graphene layer in one example is an AB-stacked bi-layer graphene layer or an ABC-stacked tri-layer graphene layer or an ABC-stacked few-layer graphene layer.

Contacts are formed over a portion of the graphene layer including at least one source contact, at least one drain contact, and at least one side-gate contact. Next, a graphene channel with one or more graphene side gates is formed in the graphene layer in between the side-gate contact, the source contact, and the drain contact. In another example, a set of side-gate contacts is formed and the graphene channel with graphene side gates is formed in between the set of side-gate contacts, the source contact, and the drain contact. In another example, the graphene channel is formed between the set of side-gate contacts, the source contact, and the drain contact, and the side gates are then formed next to the graphene channel using any conductive materials.

A top-gate dielectric layer is formed over the graphene layer. In one example, the top-gate dielectric is an oxide, a nitride, a hexagonal boron nitride, SiOx, SiNx, BNx, HfOx, AlOx, or a combination thereof. Finally, a top-gate electrode is formed on the top-gate dielectric layer over the graphene channel.

BRIEF DESCRIPTION OF THE DRAWINGS

The foregoing and other features and advantages of the subject matter disclosed herein will be made apparent from the following detailed description taken in conjunction with the accompanying drawings, in which:

FIG. 1 is a first step of a sequence of top views (A) and corresponding cross-sectional views (B) illustrating a back gate dielectric layer for forming a graphene based gate-controlled nanoconstriction device with tunable band gap;

FIG. 2 is a second step of a sequence of top views (A) and corresponding cross-sectional views (B) illustrating source/drain electrodes and side-gate electrodes for forming a graphene based gate-controlled nanoconstriction device with tunable band gap;

FIG. 3 is a third step of a sequence of top views (A) and corresponding cross-sectional views (B) illustrating graphenes channel and spacers for forming a graphene based gate-controlled nanoconstriction device with tunable band gap;

FIG. 4 is a fourth step of a sequence of top views (A) and corresponding cross-sectional views (B) illustrating top gate dielectric material for forming a graphene based gate-controlled nanoconstriction device with tunable band gap;

FIG. 5 is a fifth step of a sequence of top views (A) and corresponding cross-sectional views (B) illustrating a top gate electrode for forming a graphene based gate-controlled nanoconstriction device with tunable band gap;

DETAILED DESCRIPTION

Figure 6:
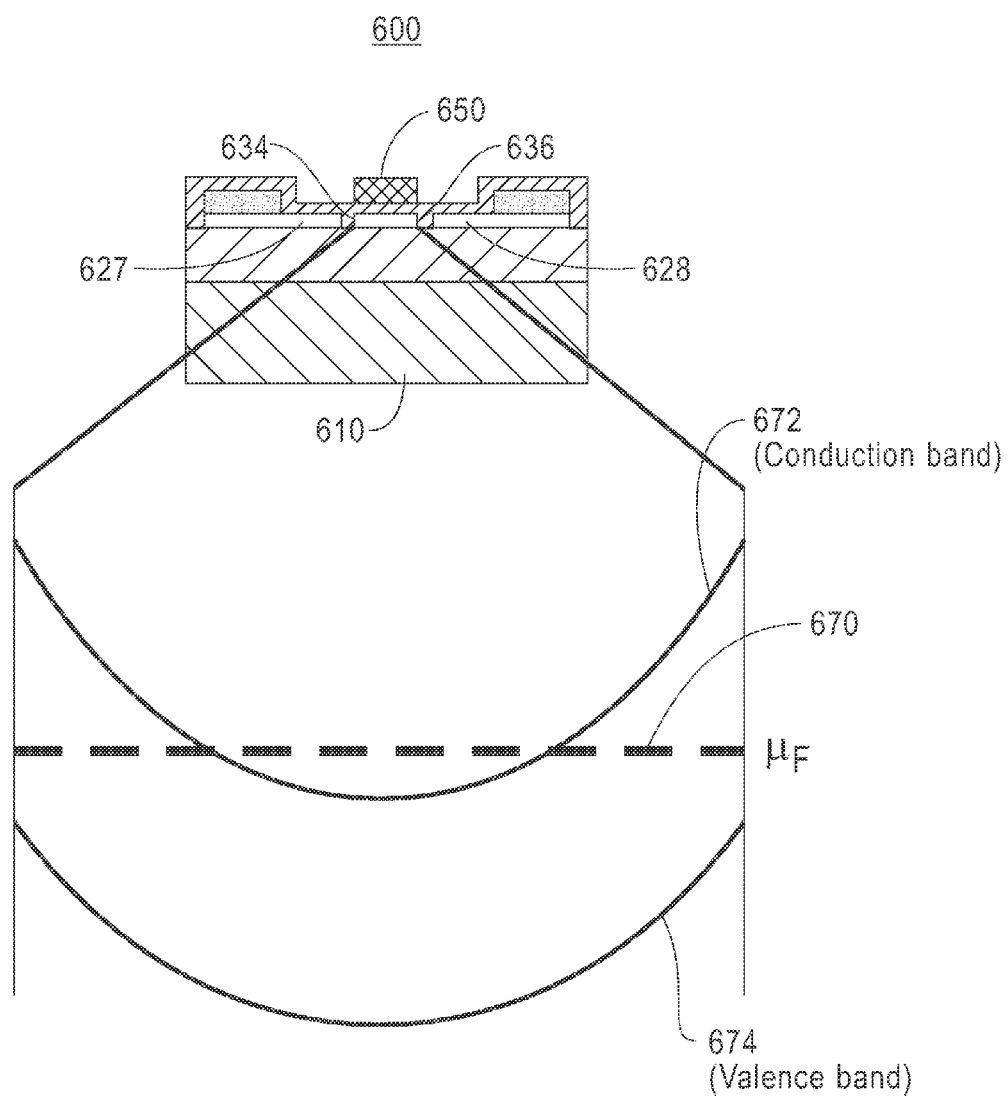
FIG. 6 is a cross-sectional view and schematic band diagram of the device in FIG. 5.

Preferred embodiments of the present invention will be described in detail hereinbelow with reference to the attached drawings.

The inventors have developed an electrically tunable nanoconstriction in graphene. In one example the present invention includes a gate-defined graphene nanoconstriction structure that uses AB-stacked bilayer, ABC-stacked trilayer, or ABC-stacked multilayer graphene as the channel material. This novel nanostructure employs a combination of top gates and planer side gates for electrostatic electron confinement, which circumvents the edge-defect scattering problem that plagues the existing graphene nanoconstriction and quantum dot devices made by the reactive-ion etching (RIE) based method.

The present invention reduces defect and impurity scattering. With proper choice of top and back-gate dielectrics that minimizes hysteresis and trap-charge problems, the nanoconstriction would then turn into a quantum point contact which, as an electron-wave beam splitter, is extremely valuable for manipulating quantum information encoded in the propagating electron-wave "flying qubits."

Method of Forming a Electrically-Controlled Nanoconstriction Device with Tunable Band-Gap FIGS. 1 through 5 are a sequence of top views (A) and corresponding cross-sectional views (B) illustrating an example method of forming an electrically tunable nanoconstriction graphene based electronic device. Line 102 in FIG. 1(A) denotes the cross section from which side-views for FIGS. 1(B) through 5(B) are shown.

Starting with FIG. 1(B), a back gate dielectric layer 110 material is formed over a substrate 100 e.g. highly doped silicon substrate or any other conductive substrate. The back-gate dielectric layer 110 material may be, for example, a thin hexagonal boron nitride (h-BN) single-crystalline film or a thin lead zirconate titanate (PZT) or a combination thereof. Back gate dielectrics may also be formed from, for example, SiOx, SiNx, BNx, AlOx, HfOx, mica, and combinations thereof deposited by, for example, atomic layer deposition (ALD), chemical vapor deposition (CVD), physical vapor deposition (PVD), or physical transfer techniques.

Next, shown is the formation of graphene layer 112 over the back-gate dielectric layer 110. The graphene layer 112 may be formed over the back-gate dielectric layer 110 in any suitable manner known in the art, such as by deposition or physical transfer. The graphene layer 112 may be AB-stacked graphene bilayers, ABC stacked graphene trilayers, ABCA stacked graphene tetralayers, and other ABC stacked graphene multilayers, or graphene bilayers, trilayers, and multilayers with slight stacking misorientations.

Then, in FIG. 2(B), metal source/drain electrodes or contacts 124, 126 and side-gate contacts 128 to the graphene layer 112 are formed. The metal contacts 124, 126, 128 may be formed by any suitable process, such as blanket deposition and etch, or by lithography resist patterning, deposition and lift-off, for example. In addition, exemplary metals for the source drain contacts 124, 126 and side-gate contact 128 may include, but are not necessarily limited to, titanium (Ti), gold (Au), palladium (Pd) and platinum (Pt).

Next, in FIG. 3(B) a graphene channel 130 is formed surrounded by spacers 134 and 136 defining graphene side gates 132 and 138 as shown. A mask for producing the desired pattern for the graphene channel 130 may comprise, for example, poly(methyl methacrylate) (PMMA), e-beam resist, or photoresist. The unwanted areas of graphene layer 112 are etched away by oxygen reactive ion etching or oxygen plasma to produce the desired pattern to form spacers 134 and 136. After formation of the graphene channel 130, a top gate dielectric layer 140 is formed over the graphene channel 130, as shown in FIG. 4(B). The top gate dielectric layer 140 need not cover the metal contacts 124, 126, and 128. For the device to work, it only needs to cover the graphene channel 130. However, FIG. 4(B) illustrates layer 140 covering all metal contacts simply because this requires one less lithography step and therefore is easier to implement. Exemplary top gate dielectric materials include oxides and nitrides, but are not necessarily limited to, h-BN, SiNx, BNx, Al$_2$O$_3$, SiO$_2$, and HfO$_2$, deposited by, for example, atomic layer deposition (ALD), chemical vapor deposition (CVD), physical vapor deposition (PVD), or physical transfer techniques. Finally, as shown in FIG. 5(B), a top gate electrode 150 is formed on the top gate dielectric layer 140 and over the channel 130. The top gate electrode 150 may be of the same material and formed in the same manner as the metal source/drain electrodes or contacts 124, 126 and side-gate contacts 128 in FIG. 2(B). The process described above provides the electrically tunable graphene based electronic nanoconstriction device of FIG. 5(A) and FIG. 5(B). In one example, the dimension of the graphene channel is greater than or equal to 100 nm as shown in FIG. 5(B).

Tunable Nanoconstriction Device

Operation of the gate tunable graphene based electronic nanoconstriction device of FIG. 5(A) and FIG. 5(B) thus formed may be further understood with reference to FIGS. 6 and 7. FIG. 6 depicts a cross-sectional view of a tunable graphene nanoconstriction device 600, similar to that fabricated in the process flow of FIGS. 1 through 5 described above. FIG. 6 also depicts a schematic band diagram along a cross-section of the device channel, in which a dashed line 670 denotes the channel chemical potential $\mu_F$, a solid curved line 672 denotes the conduction band edge and a solid curved line 674 denotes the valence band edge.

In one example, the present invention employs the electrostatic engineering of band-gap opening and band bending in bilayer graphene for local depletion of electrons. More specifically, the overall band-gap opening is achieved by breaking the bilayer symmetry with an applied vertical field between the top gate (TG) 650 and the conducting back gate 610. Local band bending is achieved by biasing the graphene side gates (SG) 627 and 628 to raise or lower the potential locally. As shown in FIG. 6, near the edges of the channel 634, 636, band bending is most severe, pushing the chemical potential deep into the band-gap to deplete electrons and create an electrostatically tunable nanoconstriction.

Figure 7A:
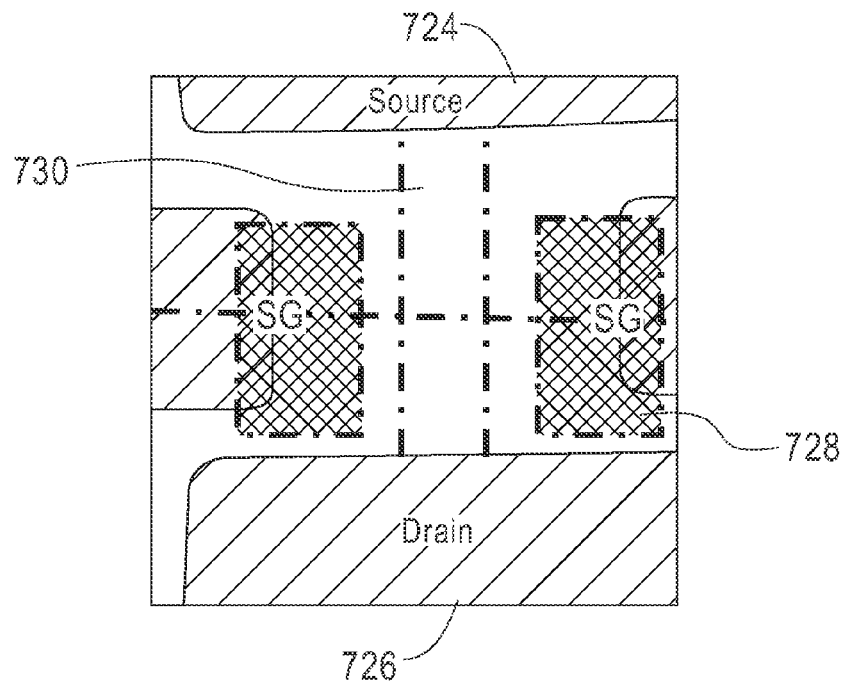
FIG. 7(A) is a top view of a prototypical globally side-gated graphene device.
Figure 7B:
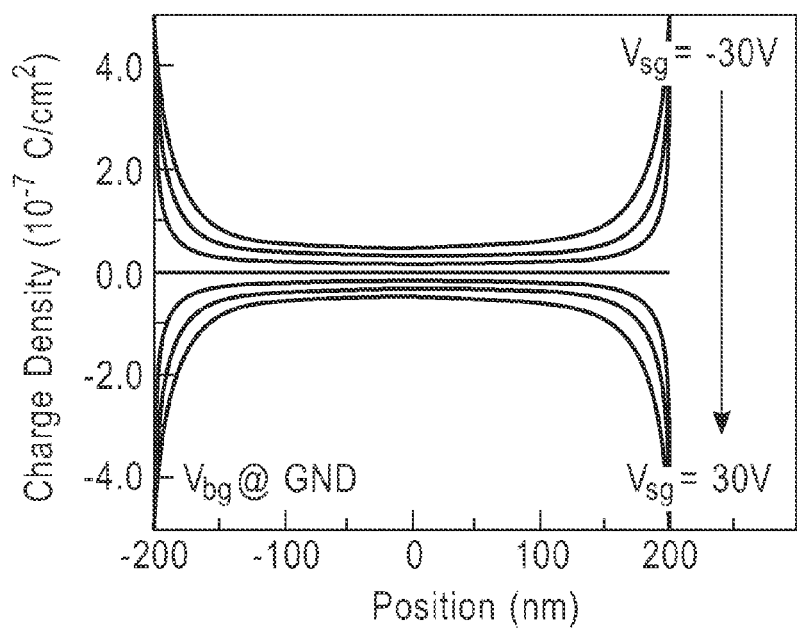
FIG. 7(B) is a simulation of the device in FIG. 7(A)

FIG. 7A is a top view of a prototypical globally side-gated graphene device with graphene side gates (SG) 728, a source contact 724, a drain contact 726 and a channel 730. To quantitatively analyze a spatial extent of band bending under electrostatic gating, a numerical result of the prototypical globally side-gated graphene device is given in FIG. 7B. In the prototypical globally side-gated graphene device shown in FIG. 7A, the channel width is approximately 400 nm and the side gate to channel distance is approximately 200 nm. Numerical simulation of the prototypical globally side-gated graphene device indicates that the side-gate induced E-field penetrates about 50-100 nm into the channel to create carrier doping and band bending. The induced carrier density profile in FIG. 7B is determined by the side-gate voltages and the device geometry. By varying the channel width and the proximity of side gates to the channel, a larger band bending can be engineered, which would then narrow the opening of the nanoconstriction to reduce the number of electron wave modes passing through the nanoconstriction. For instance, narrowing the channel width from approximately 400 nm to approximately 100 nm increases the extent of E-field induced band bending by approximately 75%. Similarly, bringing the side gates closer to the channel from approximately 200 nm to approximately 100 nm increases the effectiveness of E-field induced band bending by >50%.

Channel Geometries

Figure 8:
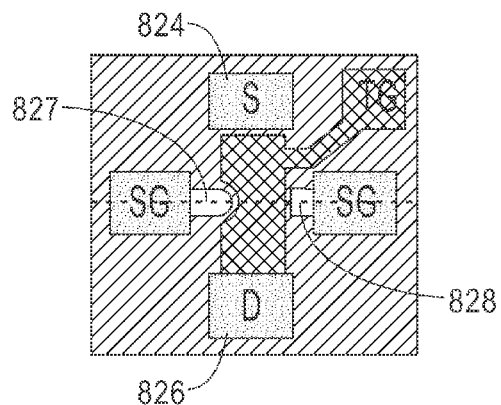
FIGS. 8-11 are a series of schematic alternative device configurations of the device in FIG. 5 illustrating different channel geometries.
Figure 9:
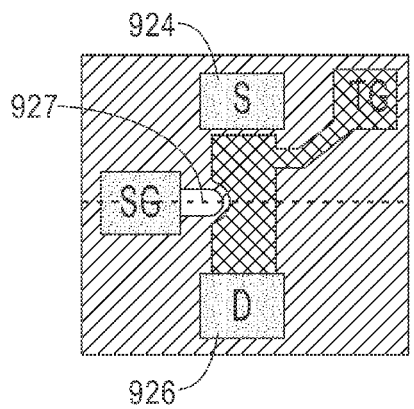
Figure 10:
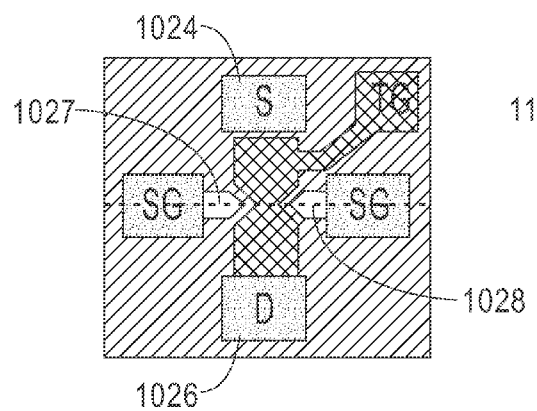
Figure 11:
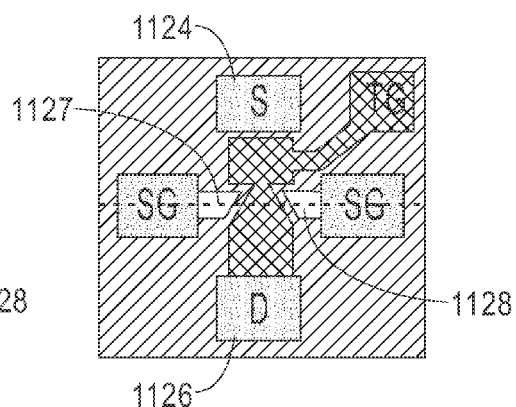

One example of the graphene channel geometry is illustrated in FIG. 5(A). Specifically, FIG. 5(A) has symmetrical channel geometry with a leftside gate 527 and rightside gate 528 illustrating an overall rounded, smooth, hour-glass shape. This graphene channel geometry is easy to fabricate and provides immunity to impurities induced by edge defects. However, a variety of constriction geometries may work under the same concept. For example, FIGS. 8-11 are a series of schematic alternative device configurations of the device in FIG. 5 illustrating different channel geometries. FIG. 8 has an asymmetrical hour-glass channel on the leftside gate 827 similar to the leftside gate 527 of FIG. 5(A). However, unlike the symmetrical rightside gate 528 of FIG. 5, the channel geometry of FIG. 8 for the rightside gate 828 is rectangular shape. FIG. 9 illustrates an asymmetrical channel geometry with a leftside gate 927 similar to the leftside 827 of FIG. 8 but there is no rightside side gate. FIG. 10 has symmetrical channel geometry with a leftside gate 1027 and rightside gate 1028 illustrating a more pointed shape as compared with FIG. 5(A). FIG. 11 illustrates symmetrical channel geometry with triangular top 1127 and 1128. The asymmetric variations of FIGS. 10 and 11 where only one of the two graphene side gates is present may also apply. All of the above provide side-gate tunability of the nanoconstriction formed in the graphene channel.

Design Flow

Figure 12:
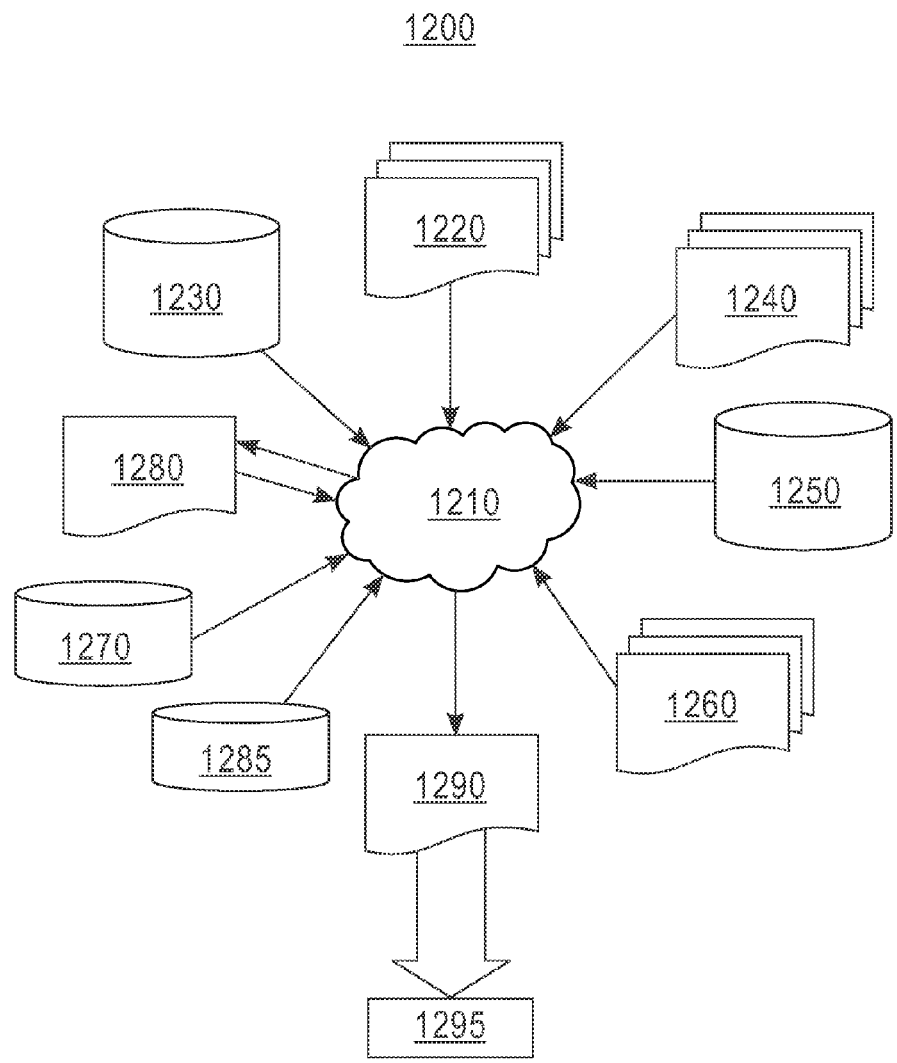
FIG. 12 is a flow diagram of a design process used in semiconductor design, manufacture, and/or test.

FIG. 12 shows a block diagram of an exemplary design flow 1200 used for example, in semiconductor IC logic design, simulation, test, layout, and manufacture. Design flow 1200 includes processes and mechanisms for processing design structures or devices to generate logically or otherwise functionally equivalent representations of the design structures and/or devices described above and shown in FIGS. 1-11. The design structures processed and/or generated by design flow 1200 may be encoded on computer-readable transmission or storage media to include data and/or instructions that when executed or otherwise processed on a data processing system generate a logically, structurally, mechanically, or otherwise functionally equivalent representation of hardware components, circuits, devices, or systems. Design flow 1200 may vary depending on the type of representation being designed. For example, a design flow 1200 for building an application specific IC (ASIC) may differ from a design flow 1200 for designing a standard component or from a design flow 1200 for instantiating the design into a programmable array, for example a programmable gate array (PGA) or a field programmable gate array (FPGA) offered by Altera® Inc. or Xilinx® Inc.

FIG. 12 illustrates multiple such design structures including an input design structure 1220 that is preferably processed by a design process 1210. Design structure 1220 may be a logical simulation design structure generated and processed by design process 1210 to produce a logically equivalent functional representation of a hardware device. Design structure 1220 may also or alternatively comprise data and/or program instructions that when processed by design process 1210, generate a functional representation of the physical structure of a hardware device. Whether representing functional and/or structural design features, design structure 1220 may be generated using electronic computer-aided design (ECAD) such as implemented by a core developer/designer. When encoded on a machine-readable data transmission, gate array, or storage medium, design structure 1220 may be accessed and processed by one or more hardware and/or software modules within design process 1210 to simulate or otherwise functionally represent an electronic component, circuit, electronic or logic module, apparatus, device, or system such as those shown in FIGS. 1-11. As such, design structure 1220 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1210 preferably employs and incorporates hardware and/or software modules for synthesizing, translating, or otherwise processing a design/simulation functional equivalent of the components, circuits, devices, or logic structures shown in FIGS. 1-11 to generate a netlist 1280 which may contain design structures such as design structure 1220. Netlist 1280 may comprise, for example, compiled or otherwise processed data structures representing a list of wires, discrete components, logic gates, control circuits, I/O devices, models, etc. that describes the connections to other elements and circuits in an integrated circuit design. Netlist 1280 may be synthesized using an iterative process in which netlist 1280 is resynthesized one or more times depending on design specifications and parameters for the device. As with other design structure types described herein, netlist 1280 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1210 may include hardware and software modules for processing a variety of input data structure types including netlist 1280. Such data structure types may reside, for example, within library elements 1230 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1240, characterization data 1250, verification data 1260, design rules 1270, and test data files 1285 which may include input test patterns, output test results, and other testing information. Design process 1210 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1210 without deviating from the scope and spirit of the invention. Design process 1210 may also include modules for performing standard circuit design processes such as timing analysis, verification, design rule checking, place and route operations, etc.

Design process 1210 employs and incorporates logic and physical design tools such as HDL compilers and simulation model build tools to process design structure 1220 together with some or all of the depicted supporting data structures along with any additional mechanical design or data (if applicable), to generate a second design structure 1290. Design structure 1290 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 1220, design structure 1290 preferably comprises one or more files, data structures, or other computer-encoded data or instructions that reside on transmission or data storage media and that, when processed by an ECAD system, generate a logically or otherwise functionally equivalent form of one or more of the embodiments of the invention shown in FIGS. 1-11. In one embodiment, design structure 1290 may comprise a compiled, executable HDL simulation model that functionally simulates the devices shown in FIGS. 1-11.

Design structure 1290 may also employ a data format used for the exchange of layout data of integrated circuits and/or symbolic data format (e.g., information stored in a GDSII (GDS2), GL1, OASIS, map files, or any other suitable format for storing such design data structures). Design structure 1290 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-11. Design structure 1290 may then proceed to a stage 1295 where, for example, design structure 1290: proceeds to tape-out, is released to manufacturing, is released to a mask house, is sent to another design house, is sent back to the customer, etc.

Non-Limiting Examples

It should be noted that some of the features of the examples of the present invention may be used to advantage without the corresponding use of other features. As such, the foregoing description should be considered as merely illustrative of the principles, teachings, examples and exemplary embodiments of the present invention, and not in limitation thereof.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The method as described above is used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

What is claimed is:

1. A non-transitory tangible computer readable medium encoded with a program for fabricating an integrated circuit structure, the program comprising instructions for performing the steps of:

forming a back-gate dielectric layer over a conductive substrate;

forming a graphene layer over the back-gate dielectric layer;

forming a plurality of contacts over a portion of the graphene layer including at least one source contact, at least one drain contact, and at least one side-gate contact;

forming in the graphene layer between the at least one source contact, the at least one drain contact and the at least one side-gate contact, a graphene channel with graphene side gates;

forming a top-gate dielectric layer over the graphene layer; and forming a top-gate electrode over the graphene channel.

2. The non-transitory tangible computer readable medium of claim 1, wherein the forming a plurality of contacts includes forming a set of side-gate contacts, and wherein the forming a graphene channel with graphene side gates includes forming the graphene channel with graphene side gates between the set of side-gate contacts.

3. The non-transitory tangible computer readable medium of claim 1, wherein the graphene side gates are formed by any conducting material.

4. The non-transitory tangible computer readable medium of claim 1, wherein the forming a graphene layer includes forming an AB-stacked bi-layer graphene layer.

5. The non-transitory tangible computer readable medium of claim 1, wherein the forming a graphene layer includes forming an ABC-stacked tri-layer graphene layer.

6. The non-transitory tangible computer readable medium of claim 1, wherein the forming a graphene layer includes forming a stacked few-layer graphene layer.

7. The non-transitory tangible computer readable medium of claim 1, wherein the forming a graphene layer includes forming an AB-stacked bi-layer, an ABC-stacked tri-layer or an ABC-stacked few layer graphene layer with stacking misorientation.

8. The non-transitory tangible computer readable medium of claim 1, wherein the forming a graphene channel with graphene side gates includes using oxygen reactive-ion etching (REI).

9. The non-transitory tangible computer readable medium of claim 1, wherein the forming a back-gate dielectric layer over the conductive substrate includes forming the back-gate dielectric layer with a thin layer of hexagonal boron nitride or mica, or a combination thereof.

10. The non-transitory tangible computer readable medium of claim 1, wherein the top gate dielectric layer comprises at least an oxide, a nitride, SiOx, SiNx, BNx, HfOx, AlOx, lead zirconate, any dielectric material, or a combination thereof.

11. A graphene-based nanoconstriction device comprising:
a back-gate dielectric layer formed over a conductive substrate;
a graphene layer formed over the back-gate dielectric layer;
a plurality of contacts formed over a portion of the graphene layer including at least one source contact, at least one drain contact, and at least one side-gate contact;
a graphene channel with graphene side gates formed in the graphene layer between the at least one source contact, the at least one drain contact and the at least one side-gate contact;
a top-gate dielectric layer formed over the graphene layer; and
a top-gate electrode formed over the graphene channel.

12. The graphene-based nanoconstriction device of claim 11, wherein the plurality of contacts includes a set of side-gate contacts, and wherein the graphene channel is between the set of side-gate contacts.

13. The graphene-based nanoconstriction device of claim 11, wherein the graphene side gates are formed by any conducting material.

14. The graphene-based nanoconstriction device of claim 11, wherein the conductive substrate includes a highly doped silicon substrate.

15. The graphene-based nanoconstriction device of claim 11, wherein the graphene layer is an AB-stacked bi-layer graphene layer.

16. The graphene-based nanoconstriction device of claim 11, wherein the graphene layer is an ABC-stacked tri-layer graphene layer.

17. The graphene-based nanoconstriction device of claim 11, wherein the graphene layer is a stacked few-layer graphene layer.

18. The graphene-based nanoconstriction device of claim 11, wherein the graphene layer includes forming an AB-stacked bi-layer, an ABC-stacked tri-layer or an ABC-stacked few layer graphene layer with stacking misorientation.

19. The graphene-based nanoconstriction device of claim 11, wherein the graphene side gates are formed using oxygen reactive-ion etching (REI).

20. The graphene-based nanoconstriction device of claim 11, wherein the back-gate dielectric layer is formed with a thin layer of hexagonal boron nitride or mica, or a combination thereof.

21. The graphene-based nanoconstriction device of claim 11, wherein the top-gate dielectric layer comprises at least an oxide, a nitride, SiOx, SiNx, BNx, HfOx, AlOx, lead zirconate, any dielectric material, or a combination thereof.

22. The graphene-based nanoconstriction device of claim 1, wherein the graphene-based electronic nanoconstriction device is gate tunable.

23. The graphene-based nanoconstriction device of claim 22, wherein the graphene-based electronic nanoconstriction device forms an electrically tunable nanoconstriction in the graphene channel.

24. The non-transitory tangible computer readable medium of claim 1, wherein the conductive substrate includes a highly doped silicon substrate.

25. The non-transitory tangible computer readable medium of claim 1, wherein the integrated circuit structure is a gate tunable graphene-based electronic nanoconstriction device.

26. The non-transitory tangible computer readable medium of claim 25, wherein the graphene-based electronic nanoconstriction device forms an electrically tunable nanoconstriction in the graphene channel.

* * * * *